(12) United States Patent
Berchtold et al.

(10) Patent No.: US 8,884,703 B2
(45) Date of Patent: *Nov. 11, 2014

(54) VRAMP LIMITING USING RESISTORS

(71) Applicant: RF Micro Devices, Inc., Greensboro, NC (US)

(72) Inventors: Jean-Christophe Berchtold, Carlsbad, CA (US); Erik Pedersen, Klarup (DK)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/950,768

(22) Filed: Jul. 25, 2013

(65) Prior Publication Data

US 2013/0307621 A1  Nov. 21, 2013

Related U.S. Application Data

(63) Continuation of application No. 13/360,094, filed on Jan. 27, 2012, now Pat. No. 8,525,595.

(60) Provisional application No. 61/436,765, filed on Jan. 27, 2011.

(51) Int. Cl.
| | |
|---|---|
| *H03F 3/04* | (2006.01) |
| *H03F 3/24* | (2006.01) |
| *H03F 3/45* | (2006.01) |
| *H03G 3/00* | (2006.01) |
| *H03F 3/195* | (2006.01) |
| *H03F 1/02* | (2006.01) |

(52) U.S. Cl.
CPC .............. *H03G 3/004* (2013.01); *H03F 3/245* (2013.01); *H03F 2200/555* (2013.01); *H03F 3/45179* (2013.01); *H03F 2200/447* (2013.01); *H03F 3/195* (2013.01); *H03F 1/0238* (2013.01); *H03F 2200/504* (2013.01)

USPC ........................................... 330/297; 330/296

(58) Field of Classification Search
USPC ........................................... 330/297, 296, 285
See application file for complete search history.

(56) References Cited

U.S. PATENT DOCUMENTS

| | | | |
|---|---|---|---|
| 6,646,511 B2 | 11/2003 | Canyon et al. | |
| 6,757,526 B1 | 6/2004 | Sharp et al. | |
| 6,917,243 B2 * | 7/2005 | Doherty et al. | ............... 330/133 |
| 7,973,521 B2 * | 7/2011 | Chen et al. | ................... 323/273 |
| 8,362,649 B2 | 1/2013 | Fisher et al. | |
| 8,538,357 B2 | 9/2013 | Pedersen et al. | |
| 2013/0029618 A1 * | 1/2013 | Pedersen et al. | ........... 455/127.2 |
| 2013/0321077 A1 | 12/2013 | Pedersen et al. | |

OTHER PUBLICATIONS

Madsen, U., "3G GMSK/EDGE power control with enhanced switching transient performance," rfdesign.com, Jan. 2006, pp. 22-30.

(Continued)

*Primary Examiner* — Henry Choe
(74) *Attorney, Agent, or Firm* — Withrow & Terranova, P.L.L.C.

(57) ABSTRACT

Power amplification devices are described, which are configured to amplify a radio frequency (RF) transmission signal. The power amplification device includes a voltage regulation circuit and a power amplification circuit. The voltage regulation circuit is configured to generate a regulated voltage for the power amplification device from a supply voltage and to adjust a regulated voltage level of the regulated voltage in accordance with a voltage adjustment gain. The voltage adjustment gain of the voltage regulation circuit is set by a feedback resistance. To help prevent the voltage regulation circuit from saturating, the voltage regulation circuit adjusts the feedback resistance to reduce the voltage regulation gain.

20 Claims, 6 Drawing Sheets

(56) References Cited

OTHER PUBLICATIONS

Notice of Allowance for U.S. Appl. No. 13/360,059, mailed May 14, 2013, 8 pages.

Notice of Allowance for U.S. Appl. No. 13/360,094, mailed Apr. 25, 2013, 7 pages.

Non-Final Office Action for U.S. Appl. No. 13/961,088, mailed Nov. 1, 2013, 5 pages.

* cited by examiner

VRAMP LIMITING USING RESISTORS

RELATED APPLICATIONS

This application is a continuation of U.S. patent application Ser. No. 13/360,094, filed on Jan. 27, 2012 and entitled "VRAMP LIMITING USING RESISTORS," now U.S. Pat. No. 8,525,595, which claims the benefit of U.S. Provisional Patent Application Ser. No. 61/436,765, filed on Jan. 27, 2011, the disclosures of which are hereby incorporated herein by reference in its entirety.

FIELD OF THE DISCLOSURE

This disclosure relates to power amplification devices configured to amplify a radio frequency (RF) transmission signal using a supply voltage and methods of operating the same.

BACKGROUND

As the number of services provided by wireless mobile communication devices increases dramatically, so does the need for mobile communication devices that can handle the various forms of signal formats required to provide these services. For example, devices in cellular telephones may need to adhere to standards such as a Global Systems for Mobile communication (GSM) standard, a Personal Communication Services (PCS) standard, an EDGE standard, and a Digital Cellular System (DCS) standard. The standards all require precise output power control over a large dynamic range in order to prevent channel interference.

The key component common to mobile communication devices is a power amplification device. Before reaching the power amplification device, a radio frequency (RF) transmission signal is too weak for transmission to a cellular base station. Therefore, it is the function of the power amplification device to boost the power of the RF transmission signal.

The power amplification device may receive the RF transmission signal with a constant envelope when the RF transmission signal is being transmitted in accordance with modern Time Division Multiple Access (TDMA) standards, such as GSM standards and PCS standards. After amplification by the amplification device, the RF transmission signal must comply with a specification known as a "burst mask." The burst mask specifies the mean power of the RF transmission signal transmitted in a particular timeslot. More specifically, the burst mask specifies an allowable ramp-up period, duration, and ramp-down period of the mean power of the RF transmission signal during a timeslot. In a TDMA standard, there may be various and multiple timeslots each having a burst mask specification. The RF transmissions signal must conform to the various burst masks specifications for the different timeslots. If the power amplification device ramps up too slowly, data at the beginning of the burst might be loss, degrading link quality. On the other hand, if the power amplification device ramps up power too quickly, this has the effects of spreading the energy of the RF transmission signal across the spectrum therefore causing spectrum interference.

Generally, power amplification devices include voltage regulation circuits, such as low-drop-out (LDO) circuits, to provide a regulated voltage to a power amplification circuit that amplifies the RF transmission signal. The LDO circuit generates the regulated voltage from a supply voltage and regulates the regulated voltage level so that fluctuation in the supply voltage level of the supply voltage do not significantly affect the regulated voltage level. This regulated voltage determines the amplification gain of the power amplification circuit. For optimum rated efficiency, the power amplification circuit is driven to operate in saturation by the LDO circuit when the RF transmission signal is a TDMA transmission signal with a constant envelope. However, the LDO circuit should not be driven into saturation because saturation results in significant spectrum interference and a degraded switching spectrum. In essence, the power amplification circuit transitions from the linear region to the saturated region or from the saturated region to the linear region too quickly when the LDO circuit is driven into saturation.

To prevent the LDO circuit from operating in saturation, prior art designs of LDO circuits have been implemented in which the voltage adjustment gain of the LDO circuit is reduced when the regulated voltage level of the regulated voltage reaches of threshold voltage level. Unfortunately, prior art designs also detect when the regulated voltage level reaches the threshold voltage level relative to an arbitrarily set voltage level. While the threshold voltage level may be set near the saturation voltage level of the LDO circuit, there are various problems with these configurations. First, the arbitrary voltage level may be set by a voltage that can experience drift as the operating conditions, such as temperature, change. Furthermore, the power amplification circuit may present a load impedance mismatch to the LDO circuit. This in turn, can cause the saturation voltage level of the LDO circuit to change. These short-comings can cause power inefficiencies and/or cause the LDO circuit to be driven into saturation, thereby, resulting in unwanted spectral splatter.

Therefore, what is needed are power amplification devices with voltage regulation circuits designed to reduce power inefficiencies and spectral splatter.

SUMMARY

This disclosure relates to power amplification devices configured to amplify a radio frequency (RF) transmission signal using a supply voltage and methods of operating the same. In one embodiment, a power amplification device has a voltage regulation circuit and a power amplification circuit. The voltage regulation circuit may be designed so as to be less susceptible to changes in operational conditions, supply voltage degradation, and/or changes in a drop-out voltage level of the voltage regulator. In this manner, power inefficiencies and spectral splatter are reduced.

The power amplification circuit of the power amplification device is operable to amplify the RF transmission signal in accordance with an amplification gain. The voltage regulation circuit provides a regulated voltage to the power amplification device that powers the amplification of the RF transmission signal. The amplification gain of the power amplification circuit is adjusted by a regulated voltage level of the regulated voltage provided by the voltage regulation circuit.

The voltage regulation circuit has a voltage adjustment gain and a feedback resistance that sets the voltage adjustment gain. The voltage regulation circuit adjusts the regulated voltage level of the regulated voltage in accordance with the voltage adjustment gain. To prevent the voltage regulation circuit from being driven into saturation, the voltage regulation circuit reduces the voltage adjustment gain by adjusting the feedback resistance. In this manner, power inefficiencies, along with spectral splatter, may be reduced.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
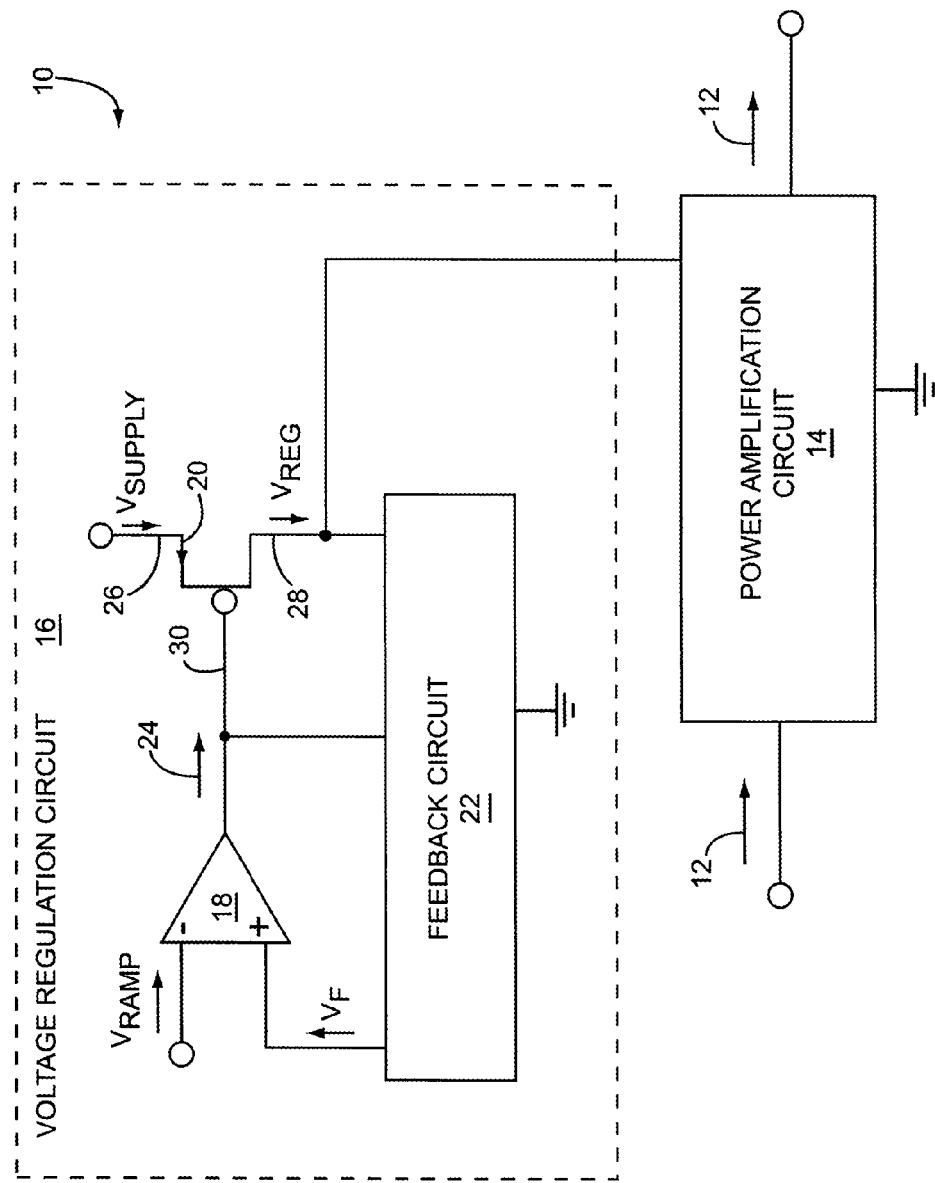
FIG. 1 illustrates one embodiment of a power amplification device configured to amplify an RF transmission signal using a supply voltage, wherein the power amplification device includes one embodiment of a voltage regulation circuit and a power amplification circuit.

FIG. 1 illustrates one embodiment of a power amplification device 10 configured to amplify an RF transmission signal 12 using a supply voltage, $V_{SUPPLY}$. The power amplification device 10 includes a power amplification circuit 14 that is operable to amplify the RF transmission signal 12 in accordance with an amplification gain. To provide the necessary energy to amplify the RF transmission signal 12, the power amplification circuit 14 receives a regulated voltage, $V_{REG}$. The power amplification device 10 includes a voltage regulation circuit 16 that is operable to generate the regulated voltage $V_{REG}$. So long as the voltage regulation circuit 16 is not saturated, the voltage regulation circuit 16 can provide the regulated voltage $V_{REG}$ so that the regulated voltage $V_{REG}$ has a regulated voltage level. The power amplification circuit 14 is operably associated with the voltage regulation circuit 16 such that the amplification gain of the power amplification circuit 14 is adjusted by the regulated voltage level of the regulated voltage $V_{REG}$. In other words, as the regulated voltage level of the regulated voltage varies so does the amplification gain of the power amplification circuit 14.

The voltage regulation circuit 16 has a differential amplifier 18, a voltage regulator 20, and a feedback circuit 22. During a transmission burst, the voltage regulation circuit 16 receives a voltage control signal which in this example is a voltage $V_{RAMP}$. This voltage control signal $V_{RAMP}$ may be designed so that the regulated voltage level of the regulated voltage $V_{REG}$ sets the amplification gain of the power amplification circuit 14 in order for the RF transmission signal 12 to comply with a burst mask specified for a timeslot. In this embodiment, a feedback signal $V_F$ is also provided to the voltage regulation circuit 16. The voltage regulation circuit 16 has a voltage adjustment gain. The voltage adjustment gain may be described as the amount of adjustment of the regulated voltage level of the regulated voltage $V_{REG}$ divided by a first voltage difference between the voltage control signal level of the voltage control signal $V_{RAMP}$ and the feedback signal level of the feedback signal $V_F$. There are other ways of describing the voltage adjustment gain. In essence, the voltage adjustment gain is a measure of how much the regulated voltage level of the regulated voltage $V_{REG}$ changes as a result of a first voltage difference between the voltage control signal level and the feedback signal level. Accordingly, as the voltage control signal of the voltage control signal $V_{RAMP}$ changes, so does the regulated voltage level of the regulated $V_{REG}$.

In the embodiment illustrated in FIG. 1, the differential amplifier 18 is configured to receive the voltage control signal $V_{RAMP}$ and the feedback signal $V_F$. The differential amplifier 18 is operable to generate a voltage regulator control signal 24 that is received by the voltage regulator 20. The regulated voltage level of the regulated voltage $V_{REG}$ may be set in accordance with a voltage regulator control signal level of the voltage regulator control signal 24. The differential amplifier 18 of FIG. 1 is configured to drive a feedback signal level of the feedback signal $V_F$ to be approximately equal to the voltage control signal level of the voltage control signal $V_{RAMP}$. When there is the first voltage difference between the voltage control signal level of the voltage control signal $V_{RAMP}$ and the feedback signal level of the feedback signal is zero, the differential amplifier 18 maintains the voltage regulator control signal level of the voltage regulator control signal 24 essentially constant. However, when the first voltage difference is not zero, the differential amplifier 18 generates the voltage regulator control signal 24 such that the voltage regulator control signal level adjust the regulated voltage level in accordance with the voltage adjustment gain of the voltage regulation circuit 16 and the first voltage difference between the voltage control signal and the feedback signal level.

As shown in FIG. 1, the voltage regulator 20 is configured to receive the voltage regulator control signal 24 and generate the regulated voltage $V_{REG}$ from the supply voltage $V_{SUPPLY}$. The voltage regulator 20 sets the regulated voltage level of the regulated voltage $V_{REG}$ in accordance with the voltage regulator control signal level of the voltage regulator control signal 24. The voltage regulation circuit 16 shown in FIG. 1 is configured as a low-drop-out (LDO) voltage regulation circuit. The voltage regulator 20 is a first field effect transistor (FET) having a first FET input terminal 26, a first FET output terminal 28, and a first FET control terminal 30. The first FET is a P-type FET and thus the first FET input terminal 26 is a source terminal, the first FET output terminal 28 is a drain terminal, and the first FET control terminal 30 is a gate terminal. The first FET input terminal 26 is coupled to receive the supply voltage $V_{SUPPLY}$ while the first FET output terminal 28 is configured to output the regulated voltage $V_{REG}$. This regulated voltage $V_{REG}$ is provided to the power amplification circuit 14. The voltage regulator 20 has the first FET control terminal 30 coupled with the differential amplifier 18 so that the first FET control terminal 30 receives the voltage regulator control signal 24 from the differential amplifier 18. Since the first FET control terminal 30 is a gate terminal, the voltage regulator 20 generates the regulated voltage $V_{REG}$ at the first FET output terminal 28 (the drain terminal in this embodiment) where the regulated voltage level of the regulated voltage is set by the voltage regulator 20 in accordance with the voltage regulator control signal level of the voltage regulator control signal 24 received from the differential amplifier 18. Furthermore, the voltage regulator 20 regulates the regulated voltage level so that variations in the supply voltage level of the supply voltage $V_{SUPPLY}$ do not significantly affect the regulated voltage level. However, the voltage regulator 20 can only regulate the regulated voltage level so long as the voltage regulator 20 is not saturated. As such, the voltage regulator 20 has a drop-out voltage level which is a minimum voltage difference required between the supply voltage level of the supply voltage $V_{SUPPLY}$ and the regulated voltage level of the regulated voltage $V_{REG}$ so that the voltage regulator 20 regulates the regulated voltage $V_{REG}$. Since the voltage regulation circuit 16 is configured as a LDO voltage regulation circuit, the drop-out voltage level is simply the saturation voltage level of the P-type FET. It should be noted that in alternative embodiments, the voltage regulation circuit 16 may be configured as a different type of voltage regulation circuit such as a standard voltage regulation circuit or a quasi LDO circuit. While not required, the LDO circuit configuration is generally preferable because the LDO circuit configuration tends to have the lowest drop-out voltage level and therefore can provide better power efficiency.

Referring again to FIG. 1, the voltage regulation circuit 16 includes the feedback circuit 22, which is coupled so as to generate the feedback signal $V_F$ from the regulated voltage $V_{REG}$. As previously discussed, the differential amplifier 18 may be configured to drive the voltage regulator 20 so that the feedback signal level of the feedback signal is approximately equal to the voltage control signal level of the voltage control signal $V_{RAMP}$. As a result, this causes the regulated voltage level of the regulated voltage $V_{REG}$ to be adjusted. The amount of adjustment of the regulated voltage level of the regulated voltage $V_{REG}$ thus depends on the amount of adjustment of the regulated voltage level is required so as to drive the feedback signal level of the feedback signal $V_F$ so that the feedback signal level is approximately equal to the voltage control signal level of the voltage control signal $V_{RAMP}$. Accordingly, the feedback circuit 22 is coupled so as to set the voltage adjustment gain of the voltage regulation circuit 16.

To prevent, or at least reduce, the likelihood that the voltage regulation circuit 16 is driven into saturation, the feedback circuit 22 reduces the voltage adjustment gain. To do this, the feedback circuit 22 has been coupled to receive the voltage regulator control signal 24 generated by the differential amplifier 18. The feedback circuit 22 is responsive to a second voltage difference between the voltage regulator control signal level and the regulated voltage level such that the voltage adjustment gain is reduced once the second voltage difference reaches a threshold voltage level. Note that the threshold voltage level is being determined relative to the voltage regulator control signal level provided to the voltage regulator 20. This may provide several advantages.

Figure 2:
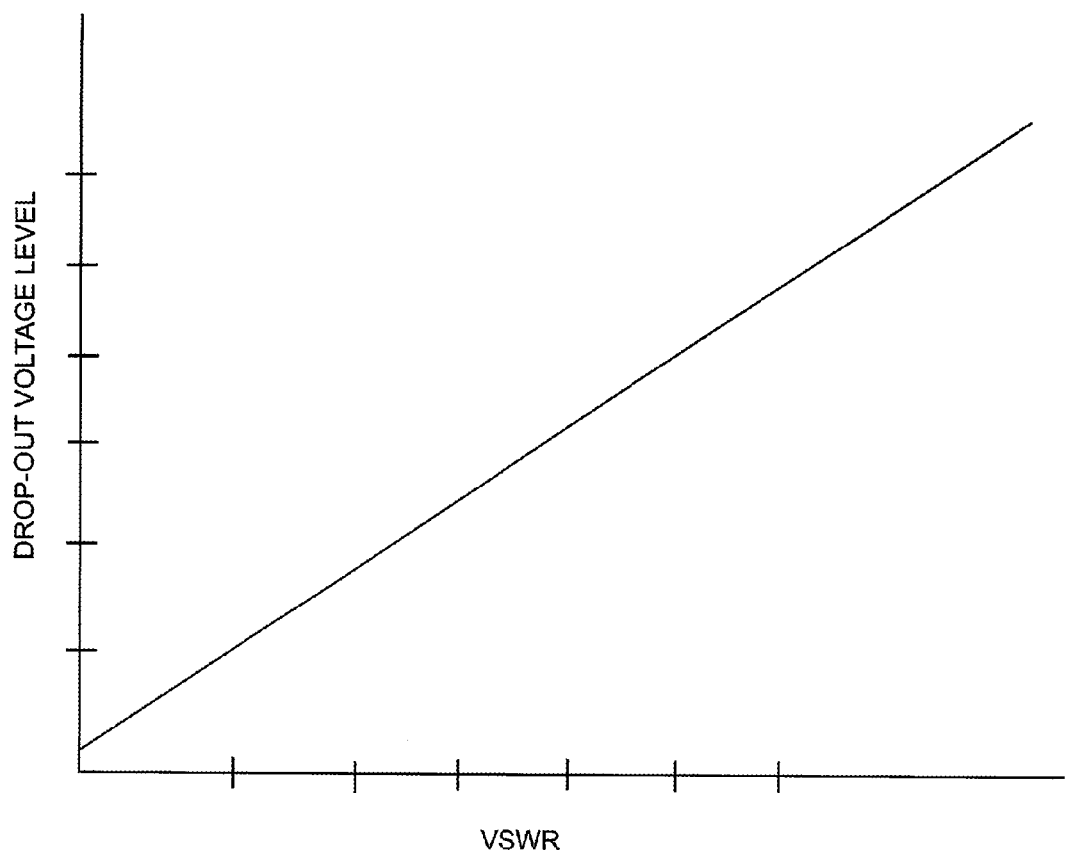
FIG. 2 illustrates a graph of one embodiment of a drop-out voltage level of a voltage regulator from the voltage regulation circuit shown in FIG. 1 as a function of a Voltage Standing Wave Ratio (VSWR).

Referring now to FIG. 1 and FIG. 2, FIG. 2 illustrates a graph of one embodiment of a drop-out voltage level of the voltage regulator 20 as a function of the Voltage Standing Wave Ratio (VSWR). The VSWR is determined in accordance with output load impedance presented to the voltage regulation circuit 16 at the first FET output terminal 28. Unlike voltage regulation circuits in which the threshold voltage level is determined with respect to an arbitrary voltage level, the drop-out voltage level of the voltage regulator 20 is defined by the strength of the voltage regulator 20, which in this case a P-type FET. FIG. 2 demonstrates that the drop-out voltage level (and thus the threshold voltage level due to the arrangement) is adjusted as the load impedance changes. As the output load impedance of the power amplification circuit 14 decreases, the VSWR decreases and the drop-out voltage level approaches zero. As shown in FIG. 2, when the output load impedance is a short circuit and thus the VSWR goes to zero, the drop-out voltage level is approximately, and thus, very close to zero. When the components of the power amplification device 10 are appropriately selected and calibrated, the regulated voltage level generally approaches very close to the saturation voltage level after the regulated voltage level reaches the threshold voltage level despite impedance mismatches between the voltage regulation circuit 16 and the power amplification circuit 14.

Figure 3:
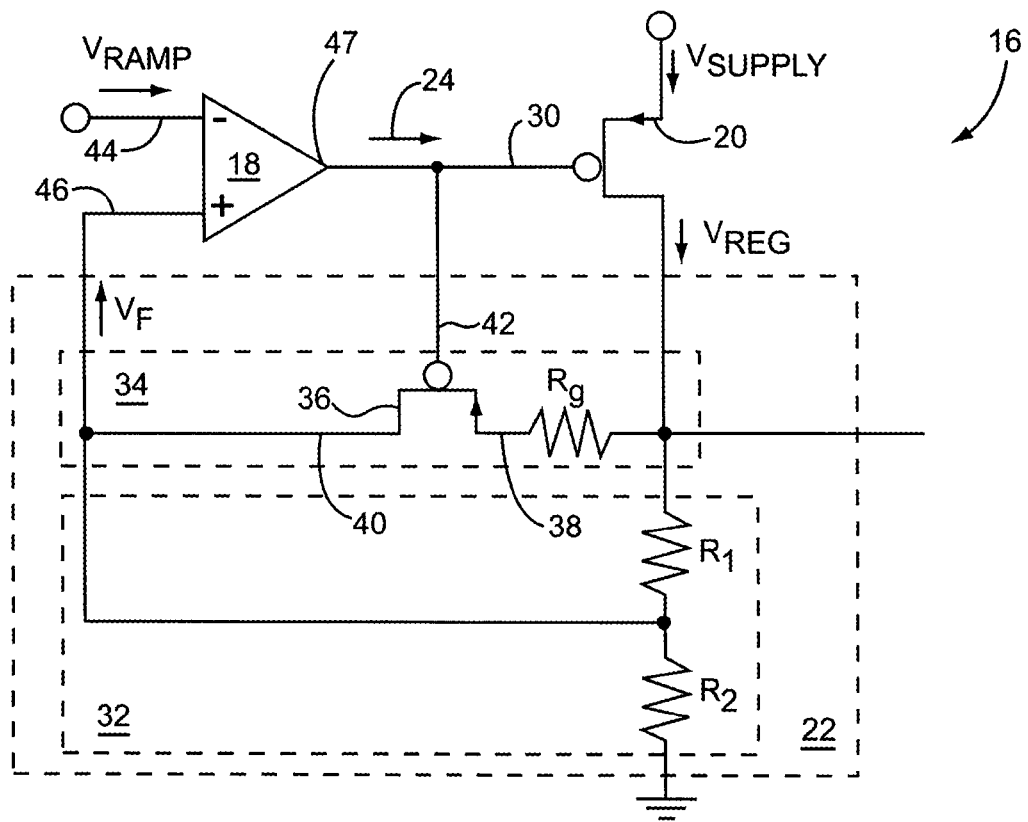
FIG. 3 illustrates a more detailed example of the voltage regulation circuit shown in FIG. 1.

Referring now to FIG. 3, FIG. 3 illustrates a more detailed example of the voltage regulation circuit 16 and the feedback circuit 22 shown in FIG. 1. The feedback circuit 22 is coupled so that the voltage adjustment gain of the voltage regulation circuit 16 is provided in accordance with the feedback resistance of the feedback circuit 22. The feedback circuit 22 shown in FIG. 2 is also an exemplary configuration of a feedback circuit operable to adjust the feedback resistance to reduce the voltage adjustment gain once the second voltage difference between the voltage regulator control signal level of the voltage regulator control signal 24 and the regulated voltage level of the regulated voltage $V_{REG}$ reaches the threshold voltage level. In this exemplary embodiment, the feedback circuit 22 includes a first feedback path 32 and a second feedback path 34. The first feedback path 32 has a first feedback path resistance. The first feedback path 32 shown in FIG. 3 includes a first resistor $R_1$ and a second resistor $R_2$ configured as a voltage divider. The voltage divider provides the first feedback path resistance and the first resistor $R_1$ is coupled to receive the regulated voltage $V_{REG}$. When the second voltage difference has not reached the threshold voltage level, the feedback resistance of the feedback circuit 22 is the first feedback path resistance. This first feedback path resistance provide the voltage adjustment gain approximated by the equation below:

$$G=1/[R_1/(R_1+R_2)]$$

However, the feedback circuit 22 is operable to adjust the feedback resistance so as to reduce the voltage adjustment gain of the voltage regulation circuit 16 once the second voltage difference reaches the threshold voltage level.

The second feedback path has a second feedback resistance. When the second voltage difference has not reached the threshold voltage level, the second feedback path is deactivated and thus the second feedback resistance does not affect (or does not significantly affect) the feedback resistance of the feedback circuit 22.

The second feedback path 34 is configured to activate once the second voltage difference reaches the threshold voltage level so as to adjust the feedback resistance of the feedback circuit 22. To activate and deactivate the second feedback path 34, the second feedback path 34 includes a second FET 36. The second FET 36 has a second FET input terminal 38 coupled to receive the regulated voltage $V_{REG}$, a second FET output terminal 40 coupled to provide the feedback of the differential amplifier 18, and a second FET control terminal 42 coupled to receive the voltage regulator control signal 24. In this manner, the second FET 36 is enabled once the second voltage difference between the regulated voltage level of the regulated voltage $V_{REG}$ and the voltage regulator control signal level of the voltage regulator control signal 24 reaches the threshold voltage level. Accordingly, the second FET 36 is coupled so that enabling the second FET output terminal 40 activates the second feedback path 34.

The exemplary second FET 36 shown in FIG. 3 is another P-type FET. Thus, the second FET input terminal 38 is another source terminal, the second FET output terminal 40 is another drain terminal, and the second FET control terminal 42 is another gate terminal. As a result, the threshold voltage level is a threshold voltage level required between the gate terminal and the source terminal to enable the second FET 36. Once the second voltage difference reaches the threshold voltage level of the second FET 36, the second feedback path 34 is activated and the second feedback resistance of the second feedback path 34 does affect the feedback resistance of the feedback circuit 22.

The second feedback path 34 shown in FIG. 2 has a third resistor $R_g$ coupled in series with the second FET 36. The second feedback path 34 has been coupled in parallel with the first resistor $R_1$. Furthermore, in this embodiment, the resistance of the resistor $R_1$ and the resistance of the third resistor $R_g$ substantially match. The second FET 36 may be formed as a relatively large P-type FET so that there is relatively small voltage drop from the second FET input terminal 38 and the second FET output terminal 40 when the second FET 36 is enabled. Accordingly, the second feedback resistance of the second feedback path is essentially provided by the resistance of the third resistor $R_g$. Once the second voltage difference reaches the threshold voltage level to activate the second feedback path 34, the second feedback resistance of the second feedback path 34 adjusts the feedback resistance of the feedback circuit 22 to reduce the voltage adjustment gain. Since the second feedback path 34 is coupled in parallel with the first resistor $R_1$, the second feedback path 34 is coupled so that the second feedback resistance of the second feedback path 34 sets a minimum gain reduction of the voltage adjustment gain. The voltage adjustment gain of the voltage regulation circuit 16 is reduced to no less than:

$$G=1/[(R_1\|R_g)/((R_1\|R_g)+R_2)]$$

To help ensure that the first resistor $R_1$ and the third resistor $R_g$ match, the first resistor $R_1$ and the third resistor $R_g$ may be formed from substantially identical segments. Embodiments of the power amplification device 10 may be fabricated as an integrated circuit provided in an integrated circuit package using any suitable semi-conductor technology, such as CMOS technology. The first resistor $R_1$ and the third resistor $R_g$ can be created from the same material to help ensure that the first resistor $R_1$ and the third resistor $R_g$ are formed as substantially identical segments.

The differential amplifier 18 has a first differential amplifier input terminal 44 configured to receive the voltage control signal $V_{RAMP}$, a second differential amplifier input terminal 46 configured to receive the feedback signal $V_F$ from the feedback circuit 22, and a differential amplifier output terminal 47 configured to output the voltage regulator control signal 24. In this embodiment, the first differential amplifier input terminal 44 is a negative terminal of the differential amplifier 18 while the second differential amplifier input terminal 46 is a positive terminal of the differential amplifier 18. As a result, a positive change in the voltage control signal level of the voltage control signal $V_{RAMP}$ results in a reduction in the voltage regulator control signal level of the voltage regulator control signal 24 thereby increasing the regulated voltage level of the regulated voltage $V_{REG}$. The converse is true when there is a negative change in the voltage control signal level of the voltage control signal $V_{RAMP}$. In alternative embodiments, the differential amplifier may not be directly connected to the voltage regulator 20 so that configurations are provided so that the feedback signal $V_F$ may be received at the negative terminal while the voltage control signal $V_{RAMP}$ is received at the positive terminal.

There may be several additional advantages provided by the feedback circuit 22 illustrated in FIG. 3. Provided that the resistances of the first resistor $R_1$, the second resistor $R_2$, and the third resistor $R_g$, are properly calibrated, the voltage regulator control signal level of the voltage regulator control signal 24 can be driven all the way, or almost all the way, to ground. In turn, this allows the regulated voltage level of the regulated voltage to reach, or almost reach, the saturation voltage level while the drop-out voltage level of the voltage regulator 20 is reduced. Since the secondary feedback resistance of the second feedback path 34 sets the minimum adjustment gain and substantially matches the resistance of the resistor $R_1$, the voltage adjustment gain is relatively stable despite variations in operational conditions such as temperature and variations in fabrication.

Figure 4:
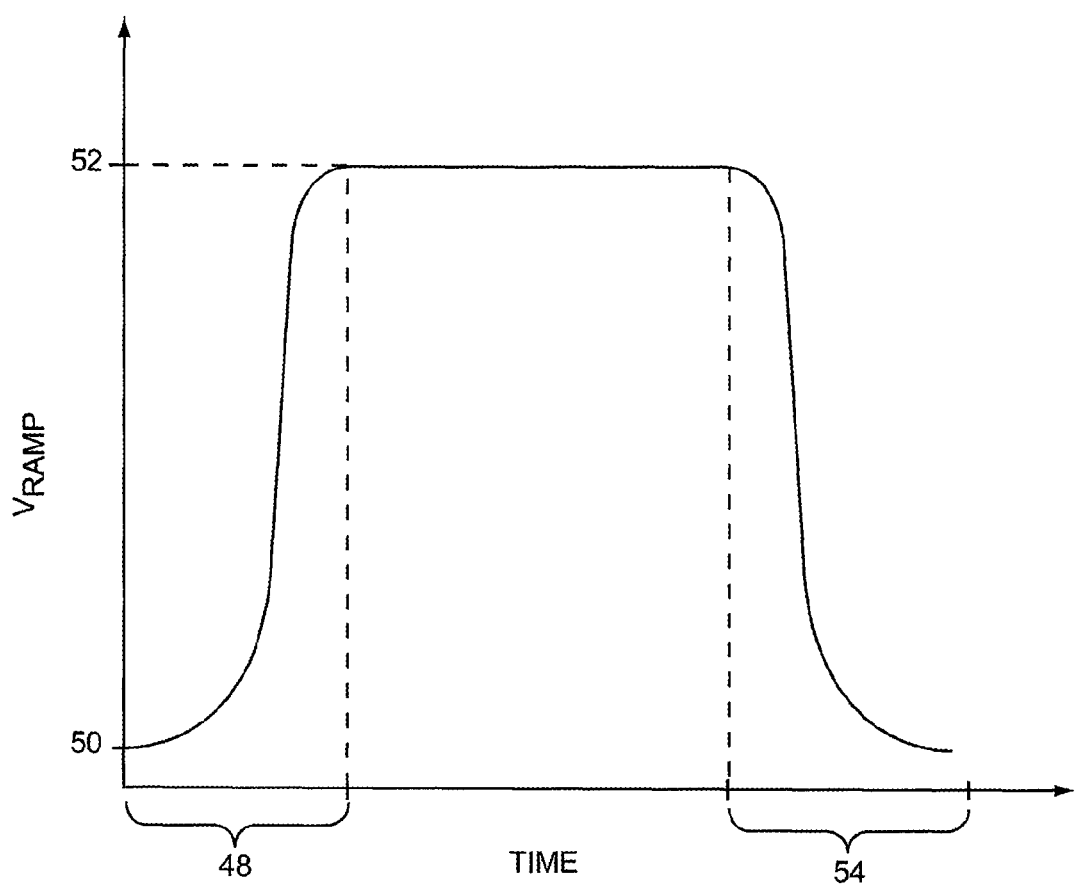
FIG. 4 illustrates one embodiment of a voltage control signal provided to the voltage regulation circuit as a function of time.

Referring now to FIGS. 1 and 4, FIG. 4 illustrates one embodiment of the voltage control signal $V_{RAMP}$. The voltage control signal $V_{RAMP}$ shown in FIG. 4 is a ramping voltage configured so that the RF transmission signal 12 is amplified by the power amplification circuit 14 to comply with a TDMA burst mask 60. In one embodiment, the RF transmission signal 12 may be a TDMA transmission signal, such as a GSM transmission signal, or a PCD transmission signal. The voltage control signal $V_{RAMP}$ is ramped up during a ramp-up period 48 such that the voltage control signal level of the voltage control signal $V_{RAMP}$ is increased from a minimum voltage control signal level 50 to a maximum voltage control signal level 52. Once the maximum voltage control signal level is reached, the voltage control signal $V_{RAMP}$ maintains the envelope of the RF transmission signal 12 constant until reaching a ramp-down period 54. During the ramp-down period 54, the voltage control signal $V_{RAMP}$ is received such that the voltage control signal level of the voltage control signal $V_{RAMP}$ is decreased from the maximum voltage control signal level 52 to the minimum voltage control signal level 50.

Figure 5:
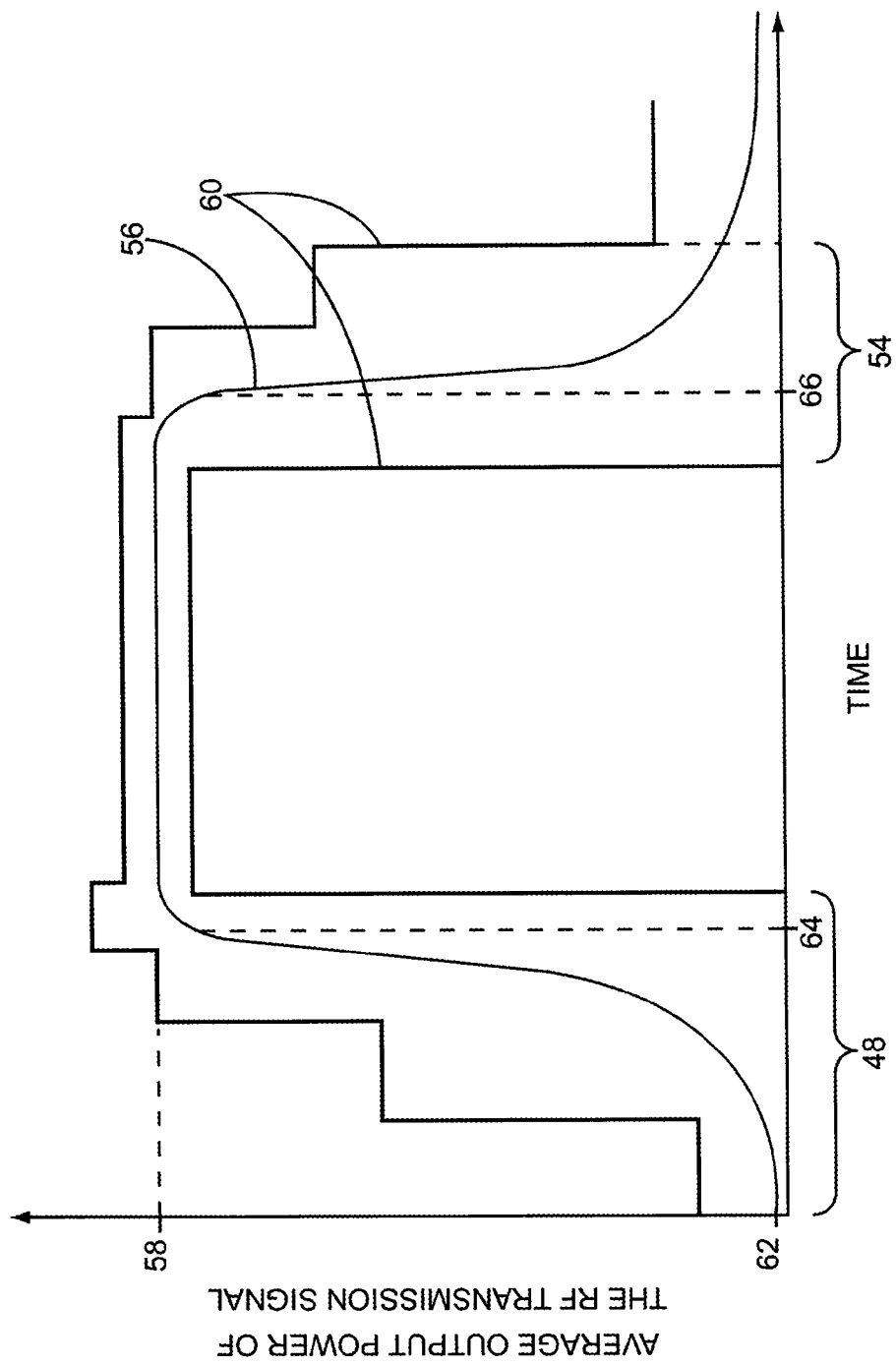
FIG. 5 is a graph illustrating one embodiment of an average output power of the RF transmission signal after amplification by the power amplification circuit shown in FIG. 1.

Referring now to FIGS. 1 and 5, FIG. 5 illustrates one embodiment of an average output power 56 of the RF transmission signal 12 after amplification by the power amplification circuit 14 shown in FIG. 1. The average output power 56 is for a single timeslot and is provided in response to the voltage control signal $V_{RAMP}$ shown in FIG. 5. During the ramp-up period 48, the average output power 56 needs to increase and properly settle at a maximum 58 within the time constraints of the TDMA burst mask 60. On the other hand, during the ramp-down period 54, the average output power 56 needs to decrease to a minimum 62 and settle within the time constraints of the TDMA burst mask 60. Time 64 in FIG. 5 represents the time during the ramp-up period 48 when the second voltage difference between the voltage regulator control signal level and the regulated voltage level reaches the threshold voltage level to reduce the voltage adjustment gain. On the other hand, time 66 in FIG. 5 represents the time when the second voltage difference again drops below the threshold voltage level thereby increasing the voltage adjustment gain. As shown in FIG. 5, the voltage adjustment gain is adjusted to provide for a soft transition without sudden increases or decreases in the average output power 56. The softness of the transition allows the power amplification circuit 14 to meet switching spectrum requirements for the timeslot.

Figure 6:
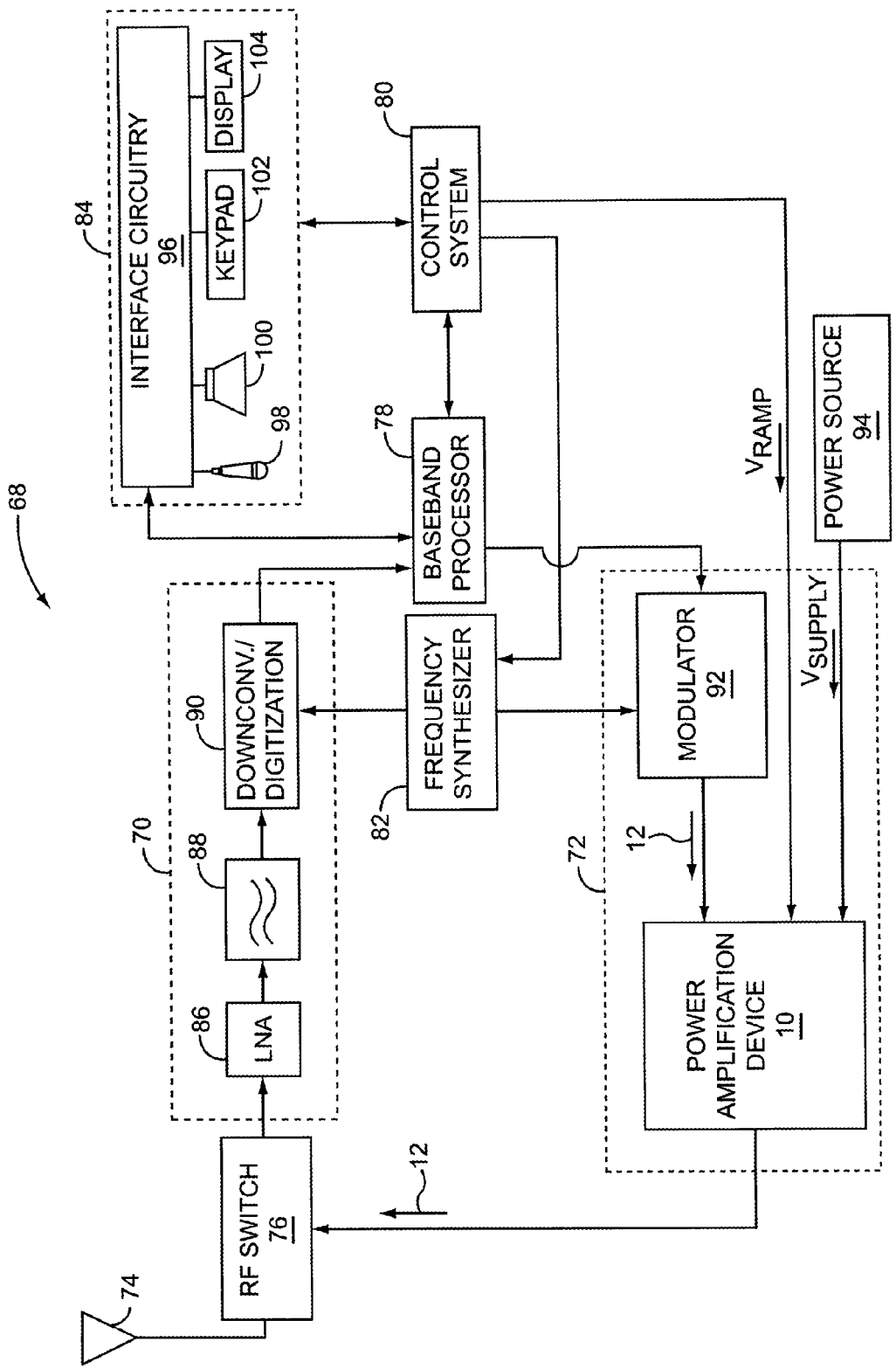
FIG. 6 illustrates one embodiment of a mobile communication device that incorporates the power amplification device shown in FIG. 1 to amplify the RF transmission signal for transmission by an antenna.

With reference to FIG. 6, an embodiment of the power amplification device 10 may be incorporated in a mobile communication device 68, such as a mobile cellular phone, personal digital assistant (PDA), and/or the like. The basic architecture of the mobile communication device 68 may include a receiver front end 70, a RF transmitter section 72, an antenna 74, a duplexer or RF switch 76, a baseband processor 78, a control system 80, a frequency synthesizer 82, and an interface 84. The receiver front end 70 receives information bearing RF receive signals from one or more remote transmitters provided by a base station. A low noise amplifier (LNA) 86 amplifies the RF receive signal. A filter circuit 88 minimizes broadband interference in the RF receive signal, while a down converter 90 down converts the filtered RF receive signal to an intermediate or baseband frequency signal, which is digitized to one or more digital streams. The receiver front end 70 typically uses one or more mixing frequencies generated by the frequency synthesizer 82.

The baseband processor 78 processes the digitized RF receive signal to extract the information or data that is conveyed in the RF receive signal. This processing typically comprises demodulation, decoding, and error corrections operations. As such, the baseband processor 78 is generally implemented in one or more digital signal processors (DSPs).

On the transmit side, the baseband processor 78 receives digitized data from the control system 80, which it encodes for transmission. The encoded data is output to the RF transmitter section 72, where it is used by a modulator 92 to modulate a carrier signal at a desired transmit frequency and thereby generate the RF transmission signal 12. The power amplification device 10 amplifies the RF transmission signal 12 to a signal level appropriate for transmission from the antenna 74. Specifically, the power amplification device 10 receives and amplifies the RF transmission signal 12 from the modulator 92 to provide the RF transmission signal 12 after amplification to the antenna 74.

As described in detail above, the power amplification device 10 provides the amplification for the RF transmission signal 12 under the control of the voltage control signal $V_{RAMP}$, which has been generated by the control system 80. The supply voltage $V_{SUPPLY}$ is received from a power source 94 such as a battery or an AC-to-DC converter.

A user may interact with the mobile communication device 68 via the interface 84, which may include interface circuitry 96 associated with a microphone 98, a speaker 100, a keypad 102, and a display 104. Alternatively, the mobile communication device 68 may include a touch screen for interface with the user. The interface circuitry 96 typically includes analog-to-digital converters, digital-to-analog converters, amplifiers, and/or the like. Additionally, it may include a voice encoder/decoder, which may communicate directly with the baseband processor 78.

The microphone 98 will typically convert audio input, such as a user's voice, into an electrical signal which is digitized and passed directly or indirectly to the baseband processor 78. Audio information encoded in the receive signal is recovered by the baseband processor 78 and is converted into an analog suitable for driving the speaker 100. The keypad 102 and the display 104 enable the user to interact with the mobile communication device 68 by inputting numbers to be dialed, retrieving address book information, monitoring call progress information, and/or the like.

Those skilled in the art will recognize improvements and modifications to the preferred embodiments of the present disclosure. All such improvements and modifications are considered within the scope of the concepts disclosed herein and the claims that follow.

What is claimed is:

1. A power amplification device configured to amplify a radio frequency (RF) transmission signal using a supply voltage, comprising:
   a voltage regulation circuit having a voltage adjustment gain and a feedback resistance that sets the voltage adjustment gain, wherein the voltage regulation circuit is configured to:
      generate a regulated voltage from the supply voltage;
      adjust a regulated voltage level of the regulated voltage in accordance with the voltage adjustment gain; and
      adjust the feedback resistance to reduce the voltage adjustment gain; and
   a power amplification circuit configured to amplify the RF transmission signal in accordance with an amplification gain and to adjust the amplification gain in accordance with the regulated voltage level of the regulated voltage.

2. The power amplification device of claim 1, wherein the voltage regulation circuit comprises a feedback circuit having the feedback resistance and coupled so that the voltage adjustment gain of the voltage regulation circuit is provided in accordance with the feedback resistance, and wherein the feedback circuit is operable to adjust the feedback resistance so as to reduce the voltage adjustment gain.

3. The power amplification device of claim 2 wherein the feedback circuit comprises:
   a first feedback path having a first feedback path resistance so that the feedback resistance is the first feedback path resistance; and
   a second feedback path having a second feedback resistance;
   wherein the voltage regulation circuit is configured to activate the second feedback path so as to reduce the voltage adjustment gain.

4. The power amplification device of claim 3 wherein:
   the first feedback path comprises a first resistor and a second resistor configured as a voltage divider to provide the first feedback path resistance, wherein the first resistor is coupled to receive the regulated voltage; and
   the second feedback path is coupled in parallel with the first resistor.

5. The power amplification device of claim 3, wherein second feedback path includes a first field effect transistor (FET), wherein the voltage regulation circuit is configured to turn on the first FET to activate the second feedback path.

6. The power amplification device of claim 5, wherein the first FET is a P-type FET.

7. The power amplification device of claim 5 wherein:
   the first feedback path comprises a first resistor and a second resistor configured as a voltage divider to provide the first feedback path resistance, wherein the first resistor is coupled to receive the regulated voltage; and
   the second feedback path comprises a third resistor coupled in series with the first FET.

8. The power amplification device of claim 7, wherein the second feedback path is coupled so that the second feedback resistance sets a maximum gain reduction of the voltage adjustment gain once the voltage regulation circuit turns on the second feedback path.

9. The power amplification device of claim 7, wherein the second feedback resistance is approximately equal to a resistance of the first resistor.

10. The power amplification device of claim 7, wherein the first resistor and the third resistor are formed from substantially identical segments.

11. The power amplification device of claim 7 wherein:
the first FET comprises a first gate terminal, a first drain terminal, and a first source terminal, wherein the first drain terminal and the first source terminal are coupled in series with the third resistor; and
the voltage regulation circuit further comprises a second FET having a second gate terminal, a second source terminal operable to receive the supply voltage, and a second drain terminal, wherein the second FET is configured to generate the regulated voltage at the second drain terminal from the supply voltage at the second source terminal;
wherein the second feedback path is coupled to the second drain terminal and the first gate terminal of the first FET is coupled to the second gate terminal of the second FET such that the first FET is activated once a voltage difference between the second gate terminal and the second drain terminal reaches a threshold voltage level.

12. The power amplification device of claim 7 wherein:
the first FET comprises a first gate terminal, a first drain terminal, and a first source terminal, wherein the first drain terminal and the first source terminal are coupled in series with the third resistor; and
the voltage regulation circuit further comprises a voltage regulator having a control terminal and an output terminal, wherein the voltage regulator is configured to generate the regulated voltage at the output terminal from the supply voltage;
wherein the second feedback path is coupled to the output terminal and the first gate terminal of the first FET is coupled to the control terminal of the voltage regulator such that the first FET is activated once a voltage difference between the control terminal and the output terminal reaches a threshold voltage level.

13. The power amplification device of claim 12, wherein the voltage regulator comprises a second FET.

14. The power amplification device of claim 12, wherein the first FET is a first P-type FET.

15. The power amplification device of claim 7 wherein:
the voltage regulation circuit further comprises a voltage regulator configured to generate the regulated voltage from the supply voltage;
the voltage regulation circuit is configured as a low-drop-out voltage regulation circuit such that the voltage regulator has a drop-out voltage level which is a minimum voltage difference required between a supply voltage level of the supply voltage and the regulated voltage level of the regulated voltage so that the voltage regulator regulates the regulated voltage;
the power amplification circuit is coupled to the second feedback path so that the power amplification circuit presents a load impedance; and
the second feedback path is configured such that the drop-out voltage level of the voltage regulator is reduced as the load impedance is reduced.

16. The power amplification device of claim 1 wherein the voltage regulation circuit further comprises a voltage regulator configured to generate the regulated voltage from the supply voltage.

17. The power amplification device of claim 16 wherein the voltage regulation circuit is configured as a low-drop-out voltage regulation circuit such that the voltage regulation circuit has a drop-out voltage level which is a minimum voltage difference required between a supply voltage level of the supply voltage and the regulated voltage level of the regulated voltage so that the voltage regulation circuit regulates the regulated voltage.

18. The power amplification device of claim 17 wherein the voltage regulation circuit further comprises a feedback circuit having the feedback resistance and coupled so that the voltage adjustment gain of the voltage regulation circuit is provided in accordance with the feedback resistance, and wherein the feedback circuit is operable to adjust the feedback resistance so as to reduce the voltage adjustment gain.

19. The power amplification device of claim 18 wherein the power amplification circuit is coupled to the feedback circuit such that the power amplification circuit presents a load impedance to the feedback circuit.

20. A method of controlling an amplification gain of a power amplification circuit configured to amplify a radio frequency (RF) transmission signal wherein the amplification gain is adjusted by a regulated voltage level of a regulated voltage, the method comprising:
generating the regulated voltage from a supply voltage;
adjusting the regulated voltage level of the regulated voltage in accordance with a voltage adjustment gain; and
adjusting a feedback resistance to reduce the voltage adjustment gain.

* * * * *